US007301646B2

(12) United States Patent
Wegmann et al.

(10) Patent No.: US 7,301,646 B2
(45) Date of Patent: Nov. 27, 2007

(54) DEVICE AND METHOD FOR THE DETERMINATION OF IMAGING ERRORS AND MICROLITHOGRAPHY PROJECTION EXPOSURE SYSTEM

(75) Inventors: Ulrich Wegmann, Koenigsbronn (DE); Helmut Haidner, Aalen (DE); Gordon Doering, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 352 days.

(21) Appl. No.: 11/038,519

(22) Filed: Jan. 21, 2005

(65) Prior Publication Data

US 2005/0190376 A1 Sep. 1, 2005

(30) Foreign Application Priority Data

Jan. 21, 2004 (DE) .................. 10 2004 004 249

(51) Int. Cl.
*G01B 11/02* (2006.01)
(52) U.S. Cl. .................. 356/515; 356/512; 356/521
(58) Field of Classification Search ............... 356/124, 356/512, 515, 521
See application file for complete search history.

(56) References Cited

U.S. PATENT DOCUMENTS

| 4,518,854 | A | 5/1985 | Hutchin |
| 4,659,917 | A | 4/1987 | Suzuki et al. |
| 5,991,004 | A | 11/1999 | Wallace et al. |
| 6,628,390 | B1 * | 9/2003 | Johnson ..................... 356/400 |
| 6,650,399 | B2 * | 11/2003 | Baselmans et al. ............ 355/55 |
| 6,816,247 | B1 * | 11/2004 | Heppner et al. ............ 356/124 |
| 7,088,458 | B1 * | 8/2006 | Wegmann ................... 356/515 |
| 2002/0001088 | A1 | 1/2002 | Wegmann et al. |
| 2004/0174533 | A1 * | 9/2004 | Nakauchi .................... 356/515 |
| 2005/0122506 | A1 * | 6/2005 | Wegmann et al. .......... 356/124 |
| 2005/0200940 | A1 * | 9/2005 | Emer ......................... 359/299 |
| 2006/0001861 | A1 * | 1/2006 | Wegmann ................... 356/124 |

FOREIGN PATENT DOCUMENTS

DE 101 09 929 A1 11/2001

* cited by examiner

*Primary Examiner*—Gregory J. Toatley, Jr.
*Assistant Examiner*—Scott M Richey
(74) *Attorney, Agent, or Firm*—Sughrue Mion Pllc.

(57) ABSTRACT

A device, a microlithography projection exposure system, and a method for the determination of imaging errors of an optical imaging system using a radiation-superposition measuring technique which operates with lateral phase offset, having an optical element arranged on the object side of the imaging system, having a first periodic structure on the object side with a predetermined periodicity direction, an optical element arranged on the image side of the imaging system, having a second periodic structure on the image side with a periodicity direction corresponding to the first periodic structure, and a detector to detect the superposition pattern of an image of the first periodic structure with the second periodic structure. The first and/or second periodic structure contains at least three periodic substructures, which are arranged offset relative to one another by a predetermined phase offset in the periodicity direction, and the detector has a plurality of detector elements, the number of which is matched to the number of substructures and/or which respectively have a number of detector surfaces adapted for a predetermined aberration determination. In addition or as an alternative, it is possible to operate with a Moiré technique which produces a fringe superposition pattern.

20 Claims, 8 Drawing Sheets

DEVICE AND METHOD FOR THE DETERMINATION OF IMAGING ERRORS AND MICROLITHOGRAPHY PROJECTION EXPOSURE SYSTEM

The following disclosure is based on German Patent Application No. 10 2004 004 249.7 filed on Jan. 21, 2004, which is incorporated into this application by reference.

BACKGROUND OF THE INVENTION

1. Field of the Invention

The invention relates to a device and to a method for the determination of imaging errors of an optical imaging system using a radiation-superposition measuring technique which operates with lateral phase offset, for example an interferometric wavefront measuring technique or a Moiré measuring technique, the device having an optical element to be arranged on the object side of the imaging system, having a first periodic structure on the object side with a predetermined periodicity direction, an optical element to be arranged on the image side of the imaging system, having a second periodic structure on the image side with a periodicity direction corresponding to the first periodic structure, the image of the first periodic structure together with the second periodic structure forming an interference or superposition pattern, and a detector to detect the interference or superposition pattern, as well as to a microlithography projection exposure system equipped with such a device. The term object side is here generally intended to mean the region in the beam path preceding the optical imaging system in question, i.e. the specimen, and the term image side is likewise used to denote the entire region in the beam path after the specimen.

2. Description of the Related Art

Such devices and methods for image error measurement are widely known. One application is to determine the imaging errors of high-precision imaging systems, such as those used in microlithography projection exposure systems for the structuring of semiconductor devices. In interferometric wavefront measuring techniques, the detector is usually positioned in a plane, conjugate with the pupil plane of the imaging system, in the light path behind the image plane of the optical imaging system. In the Moiré measuring technique, conversely, the detector is positioned in the image plane of the imaging system, or the image plane is projected onto the detector surface by means of suitable optical elements, for example imaging optics or faceplates. When working with coherent illumination, the detector may also be placed in a Talbot plane behind the image plane.

U.S. Pat. No. 5,991,004 describes a device for defocus determination, which can be used to maintain the positioning of a wafer stage at the focal distance of a microlithography projection objective. To that end, a Moiré superposition pattern is generated by projecting a first Moiré grating onto a second Moiré grating. The second grating is preferably tilted relative to the plane into which the first grating is projected by the objective, so that only one part of the second grating at a time lies at the focus of the objective. A two-dimensional CCD array is used in order to record the Moiré pattern. It detects the movement of rings in the Moiré pattern when the focal plane is shifted, and in particular their movement frequency with respect to the columns of pixels in the CCD array. The movement frequency is then evaluated, for example by means of a fast Fourier transform (FFT), in order to determine the centre of the Moiré pattern and its movement, which is used as a measure of the defocusing.

A wavefront measuring device as disclosed in Patent specification DE 101 09 929 A1, (corresponding to US 2002/0001088A1) which is integrated in a component together with the imaging system to be measured, has an illumination mask on the object side and, on the image side, a diffraction grating as well as a detector having a two-dimensional CCD array, which is read out for the image error determination. In order to measure the image errors, the grating on the image side is successively shifted laterally according to a shear interferometry technique. The phase value calculation and the wavefront reconstruction, as well as the subsequent calculation of the aberration coefficients, are carried out in a suitable evaluation computer. The speed of the measurement is crucially determined by the integration and readout times of the detector, the number of phase steps and the computation time for determining the phase and reconstructing the wavefront.

U.S. Pat. No. 4,659,917 describes a device for focus determination having a plurality of sensor rows. Using a beam splitter, the device divides the exit pupil of an optical imaging system into a multiplicity of exit pupils, the image-generating light rays of which produce a multiplicity of image intensity distributions. The sensor rows respectively comprise a multiplicity of sensors and are arranged at the positions of the image intensity distributions. The sensors deliver output signals corresponding to the intensity distributions, and these are used to detect the relative position of the image intensity distributions so as to determine the focal position, i.e. the image plane position, of the optical imaging system.

U.S. Pat. No. 4,518,854 describes a wavefront sensor which combines features of a wavefront sensor operating by shear interferometry with features of a Hartmann wavefront sensor. Sensor data for measuring the wavefront are obtained both according to the shear interferometry technique and according to the Hartmann pupil splitting principle. The sensor data determined according to the two principles are combined by long-term averaging, which is intended to increase the sensitivity of the wavefront measurement.

SUMMARY OF THE INVENTION

It is an object of the invention to provide a device and a method of the type mentioned in the introduction, which allow at least one focus and/or astigmatism determination of an optical imaging system, and if need be an adjustment of the image plane position, in a relatively short time and with a relatively low cost. It is also an object to provide a microlithography projection exposure system equipped therewith.

In a first aspect, the invention achieves this object by providing a device for the determination of imaging errors of an optical imaging system using a radiation-superposition measuring technique which operates with lateral phase offset, comprising: an optical element to be arranged on the object side of the imaging system, having a first periodic structure on the object side with a predetermined periodicity direction, an optical element to be arranged on the image side of the imaging system, having a second periodic structure on the image side with a periodicity direction corresponding to the first periodic structure, an image of the first periodic structure together with the second periodic structure forming an interference or superposition pattern, and a detector to detect the interference or superposition pattern.

In this device the first and/or second periodic structure contains at least three periodic substructures, which are arranged offset relative to one another by a predetermined phase offset in the periodicity direction. The detector has a plurality of detector elements and the number of detector elements is matched to the number of substructures and/or each detector element has a number of detector surfaces adapted for a predetermined aberration determination, in particular a focus and/or astigmatism determination.

The mutual offset of the periodic substructures makes it possible to produce a lateral phase offset through the spatial arrangement of a plurality of periodic structures next to one another, instead of by chronologically successive displacement of a single periodic structure. This makes it possible to take measurements with different phase relations chronologically in parallel instead of sequentially, which saves time during the measurement. It also avoids measurement inaccuracies which may occur during lateral displacement of the periodic structure.

Short measurement times can also be achieved, in particular, by matching the number of detector elements to the number of substructures, i.e. only as many detector elements or detector surfaces are provided as are minimally necessary for evaluating the interference/superposition pattern for the relevant measurement task. If, for example, each detector element has only a minimum required number of detector surfaces matched to a focus and/or astigmatism determination, then such an element can be evaluated comparatively quickly.

One refinement of the invention provides a detector element on the detector for each periodic substructure. In the case of a shear interferometry wavefront measuring technique, each detector element has at least two detector surfaces arranged mutually offset in the periodicity direction, and at least one detector surface in the case of a Moiré measuring technique. The restriction to a few detector surfaces, in particular two of them, and the concomitant low spatial resolution of the detector element is sufficient for certain measurement tasks, for example in order to determine defocus and/or astigmatism.

In wavefront measuring techniques to determine the gradient of the wavefront at a point of the pupil, for instance, it is typically necessary to evaluate at least three detector elements each having two detector surfaces, the detector elements being placed so that they are assigned to three different periodic substructures and one detector surface of each detector element is respectively assigned to a common position in the pupil. For this pupil position, interference signals are therefore available for three different phase relations between the periodic structure on the object side and the periodic structure on the image side. Since the gradient of the wavefront in the event of a defocus has an approximately linear profile in the shear direction, i.e. in the periodicity direction, with the shear interferometry technique the gradient of the wavefront is needed for at least two points in the pupil which are mutually offset in the shear direction in order to determine the defocusing. Determination of the defocus by shear interferometric wavefront measuring therefore requires three detector elements, corresponding to the number of periodic substructures, each having at least two detector surfaces, corresponding to the number of pupil positions. The wavefront profile in the shear direction can be approximated by higher-order polynomials by using more detector surfaces. This makes it possible to distinguish whether the defocusing is due to changes in the object distance or in the image distance, in order to compensate suitably therefor.

In one refinement of the invention, a row of CCDs aligned in the periodicity direction of the periodic structures, a row of diodes or a quadrant sensor arrangement is used as the detector. It is thus possible to employ known components in the design of the detector, so that it can be produced inexpensively.

In one refinement of the invention the relative phase offset, i.e. to within integer multiples, is one fourth of the period length of the periodic structures. When four correspondingly offset periodic structures are used, it is possible to employ known evaluation algorithms, e.g. Fourier transform, with an advantageously low computation load.

In one refinement of the invention, it is designed to determine the Petzval surface position and, to that end, it has at least three first and three second periodic structures positioned at different locations not lying on a line in an illumination field. It is then possible to determine the Petzval surface position from three measurements of the focal position at non-collinear points. The Petzval surface position can be found more precisely if more than three measurements are carried out with more than three periodic structures.

In a second aspect the invention provides a device for the determination of imaging errors of an optical imaging system using a Moiré measuring technique, comprising: an optical element to be arranged on the object side of the imaging system, having a first periodic structure on the object side with a predetermined periodicity direction, an optical element to be arranged on the image side of the imaging system, having a second periodic structure on the image side with a periodicity direction corresponding to the first periodic structure, an image of the first periodic structure together with the second periodic structure forming a superposition pattern, and a detector to detect the superposition pattern. The first and second periodic structures are Moiré structures which are designed to produce a fringe pattern of the superposition pattern, the fringe pattern naturally having a longer period than the superposition pattern on which it is based. A suitably configured detector records the superposition pattern at least at three locations which are phase-offset relative to the fringe pattern. The fact that the period of the fringe pattern is in general significantly longer than that of the superposition pattern facilitates the choice and arrangement of suitable detector surfaces. It should be understood that the device according to the first aspect of the invention as mentioned above may also have the features of the device according to this second aspect of the invention.

In one refinement of the invention, the device is designed to measure imaging errors with a measurement speed of up to several kilohertz. Defocus and astigmatism, in particular, can consequently be determined by this device with a measurement speed in the range of 1 kHz or more.

In one refinement of the invention, the interferometric wavefront measurement or Moiré distortion measurement is carried out with the aid of illuminating radiation which is also employed by the optical imaging system in normal imaging operation. If need be, this allows a measurement to be carried out during the normal imaging operation. When it is used in a microlithography projection exposure system, for example, a projection objective thereof can be measured during exposure operation by providing the first periodic structure on the object side, for example on a reticle, and the second periodic structure at a suitable position on the image side, for example in the image plane of the projection objective.

In one refinement of the invention, the detector is designed to detect the interference or superposition pattern in an image plane or a Talbot plane of the optical imaging system or behind the image plane with the interposition of imaging optics or a faceplate.

One device refined according to the invention is suitable for determining an image positioning error both in the z direction, i.e. parallel to the beam path or the optical axis of the optical imaging system, and also in an xy direction perpendicular to this, and thereby to constitute an xyz image position sensor. In addition or as an alternative, it furthermore makes it possible to determine a tilt of the image plane relative to the object plane of the optical imaging system.

In a refinement of the invention, the device is designed to determine imaging errors which are due to lens heating effects, ambient changes such as changes in the temperature, the moisture content and/or an air pressure or flushing gas pressure, refractive index changes of an immersion medium being used, movements and drift effects of manipulators of the imaging system and/or wavelength changes and/or polarization changes of the imaging radiation being used. To that end, if need be, the device may be designed as a pure diagnostic tool to ascertain the imaging errors caused by this, or it may furthermore contain a control loop to compensate for such imaging errors.

In one refinement of the invention, the device is supplemented with a control loop to control the relative position of the object and image planes for the optical imaging system. With an appropriately high measurement speed and depending on the embodiment, for example, the image position and/or the object position in the x and/or y direction and/or the image distance and/or the object distance in the z direction and/or a relative tilt of the image plane and the object plane for the optical image imaging system can be controlled rapidly enough, for example, in order to counteract any degradation of the imaging properties due to inaccurate focusing. If need be, the control loop allows rapid in situ compensation for imaging errors which are due to a wide variety of factors such as lens heating effects, ambient changes (for example changes in the temperature, the moisture content and/or an air pressure or flushing gas pressure), a change in the refractive index of an immersion medium (for example due to changes in its temperature or composition), movements and drift effects of manipulators of optical components of the imaging system, movements and drift effects of a reticle stage and/or a wafer stage in the case of lithography projection exposure systems, changes in the wavelength and/or the polarization of the radiation being used. These influencing factors typically affect the astigmatism and focus of imaging systems, in particular, and this effect can be determined very reliably and with relatively straightforward means by the device according to the invention.

In another configuration of the invention, in order to correct errors which have been found, the control loop has an appropriate compensating action on manipulators of the imaging system, which may in particular be manipulators for adjusting optical components such as lenses in one, two or three spatial directions, manipulators for adjusting a reticle stage and/or a wafer stage, pressure manipulators for adjusting an (ambient) pressure such as an air pressure or flushing gas pressure, and/or manipulators for changing the refractive index of the immersion liquid.

At this point, it should be explicitly mentioned that the determination of image positioning errors by the corresponding xyz image position sensor and the position control by the control loop are suitable both for the static case, in which the setpoint position of the image plane relative to the object plane is constant over time, and for the dynamic case in which the relative setpoint position of the image plane and object plane varies in a predetermined way as a function of time. For example, the latter situation is encountered in wafer scanners in which a lateral relative shift of the image plane and object plane is carried out with a predeterminable, typically constant speed during a scanning process.

In still another aspect the invention provides a microlithography projection exposure system including a device according to any of the first and second aspects of the invention mentioned above, for the image error measurement of a projection objective of the projection exposure system, which has additional imaging optics for imaging the first periodic structure onto the second periodic structure. In such a system, for example, the Petzval surface position and/or the image plane position can be determined in real time during the exposure operation with the aid of the imaging error determination device, and can be adjusted if required.

The method according to the invention makes it possible, as required, to determine the z defocusing and/or the xy positioning error of the image plane relative to the object plane.

In a refinement of the invention, the method makes it possible to compensate for imaging errors which have been determined, such as z defocusing and/or the xy positioning error.

BRIEF DESCRIPTION OF THE DRAWINGS

Preferred embodiments of the invention are represented in the drawings and will be described below.

FIG. 2 shows a schematic plan view of the two-surface detector element in FIG. 1, FIGS. 3a and 3b respectively show a plan view of a first periodic structure having four periodic substructures and a second periodic structure in the x direction for a wavefront measuring device to determine the focus with phase shifting in the x direction.

DETAILED DESCRIPTION OF PREFERRED EMBODIMENTS

Figure 1:
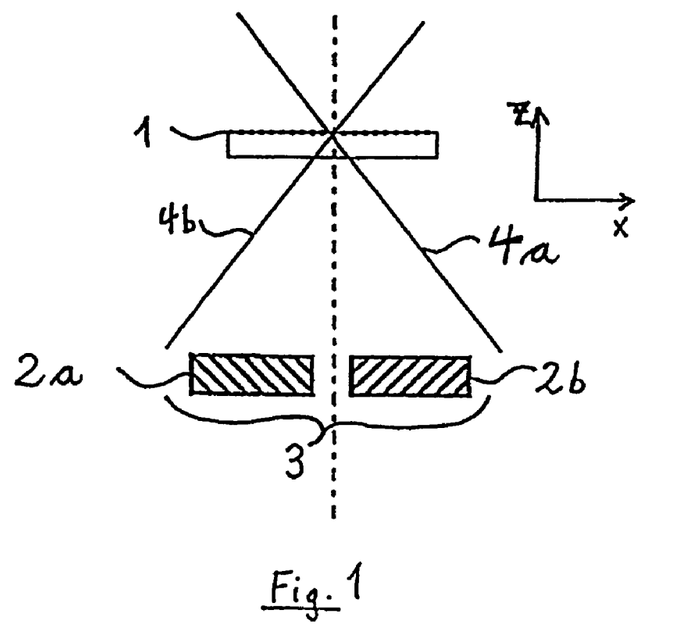
FIG. 1 shows a schematic side view of a part, essential to the invention, of a wavefront measuring device for focal position determination with a two-surface detector element.
Figure 2:
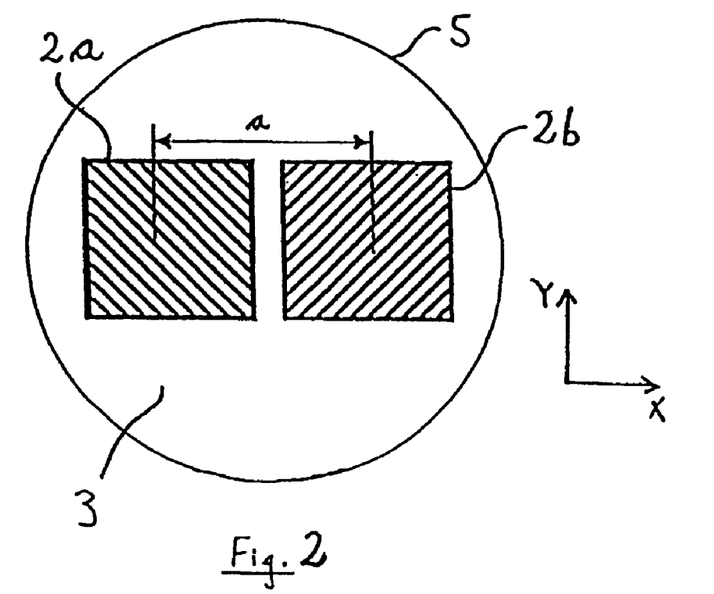

FIGS. 1 and 2 show a part, which is essential to the invention, of a relatively simply constructed wavefront measuring device operating by a shear interferometry technique, by which a predeterminable focal position of an optical imaging system (not shown) can be recorded and, for example, kept constant on the basis of this. To that end, the device comprises a periodic grating 1 to be fitted on the image side, for example in an image plane of the optical imaging system, and a periodic grating (not shown) to be fitted on the object side, for example in an object plane of the optical imaging system. A first square detector surface 2a and a second square detector surface 2b of a detector element 3 are arranged next to each other with a spacing a along the x direction of an xyz coordinate system indicated in FIGS. 1 and 2. The detector surfaces 2a, 2b respectively constitute an individually addressable pixel of the detector 3, which records the occurring intensity as measurement information of the relevant surface region. They may, for example, be formed by rapidly reacting and readable photodiode elements.

FIG. 1 furthermore shows the boundary 4a, 4b of a longitudinal section through a light cone, which contains peripheral rays of a pupil image of the optical imaging system and spans the two detector surfaces 2a, 2b. Its circular cross-sectional edge 5 is shown in FIG. 2 and represents the pupil image edge. The entire pupil does not need to be illuminated in practice, and it is sufficient to illuminate as far as the edges of the detector surfaces 2a, 2b. It is therefore possible to adapt the shape of the detector element 3 and its distance from the grating 1 to the illumination conditions, so that it is even possible to operate with an illumination aperture having incomplete pupil illumination.

The periodic grating on the object side is projected using predetermined measuring or illuminating radiation, for example by the actual imaging system to be measured, into the plane of the grating 1 on the image side and produces a superposition pattern with it. In the periodicity direction, i.e. the x direction, one of the two periodic gratings contains at least three adjacent substructures, which are mutually phase-offset. Correspondingly, at least two other detector elements (not shown) of identical structure are arranged so that one detector is assigned to each periodic substructure.

The detector surfaces 2a, 2b of each detector element 3 are each assigned a point in the pupil plane of the imaging system, corresponding detector surfaces of the different detector elements respectively being assigned a common pupil point. By evaluating the integral intensity values obtained for a particular pupil point by respectively assigned detector surfaces of the at least three detector elements, it is possible to find the derivative of the wavefront in the periodicity direction for this pupil point. The wavefront derivative is determined similarly at a second pupil point. It is possible to determine the defocus by knowing the gradient of the wavefront derivative at two pupil points. A device according to FIG. 1 therefore makes it possible to identify changes in the focal position, i.e. the image plane position, with a simple and fast detector in conjunction with fast evaluation electronics. Together with an appropriate focus control loop, it is therefore possible to stabilize the focus of an optical imaging system in real time during the imaging operation of the imaging system.

Figure 3A:
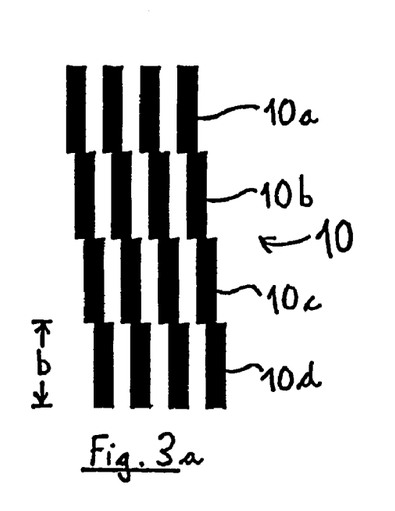

FIG. 3a shows a schematic plan view of a first periodic structure 10 having four periodic substructures 10a, 10b, 10c, 10d for a wavefront measuring device to determine the focus with phase shifting in the x direction. FIG. 3a shows a corresponding second periodic structure 11 which does not have substructures. In measuring operation, for example, the first structure 10 is positioned on the object side and the second structure 11 is positioned on the image side of an optical imaging system to be measured. As an alternative, it is possible to interchange the positions of the first and second periodic structures 10, 11 with respect to the optical imaging system. The first periodic structure 10 is designed as a line grating applied to a substrate, having four substructures or phase stages 10a, 10b, 10c, 10d of length b in the y direction which are arranged next to one another and are periodic in the x direction with identical period lengths. The substructures are respectively shifted relative to one another in the x direction by one fourth of the period length of the periodic structure. There is therefore a phase increment of 90° between each pair of adjacent substructures 10a, 10b; 10b, 10c; and 10c, 10d. The second periodic structure 11 as shown in FIG. 3b is produced as a line grating with a periodicity direction in the x direction and does not have any phase stages.

In measuring operation, the first periodic structure 10 is projected onto the second 11, so as to produce a superposition pattern. Owing to the four phase stages of the periodic structure 10 along the y direction, the superposition pattern has four superposition sub-patterns. It should be mentioned at this point that, for the sake of simplicity, the term superposition pattern here generally includes any type of superposed radiation, in particular interferograms of interferometric measuring methods in the strict sense as well as Moiré superposition patterns.

An advantageous effect on the evaluation of the superposition pattern is obtained when the period length of the second periodic structure 11 is the same as that of the image of the first periodic structure 10. The ratio of the period lengths of the first and second periodic structures is therefore preferably matched to the imaging scale of the imaging system.

Figure 3B:
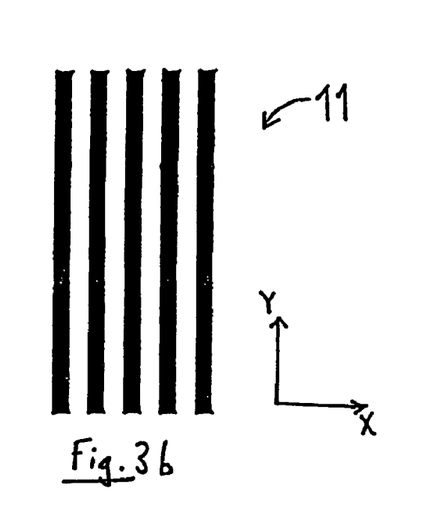
Figure 4:
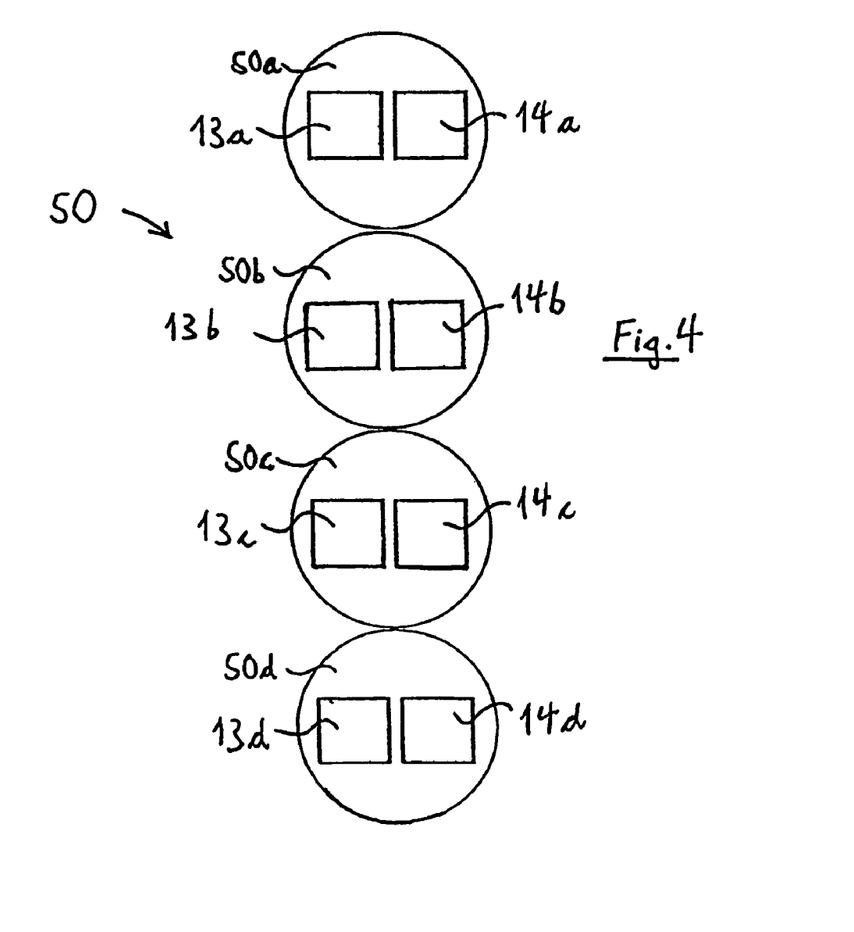
FIG. 4 shows a schematic plan view of a detector with four detector elements, respectively having two detector surfaces arranged next to each other in the x direction, for use in combination with the periodic structures in FIGS. 3a and 3b, FIGS. 5a and 5b respectively show a plan view of a first periodic structure having four periodic substructures and a second periodic structure for a wavefront measuring device to determine the focus with phase shifting in the y direction.

FIG. 4 shows a schematic plan view of a detector 50 for use in combination with the periodic structures in FIGS. 3a and 3b. The detector 50 has four detector elements 50a, 50b, 50c, 50d respectively having a first detector surface 13a, 13*b*, 13*c*, 13*d* and a second detector surface 14*a*, 14*b*, 14*c*, 14*d* arranged offset in the x direction relative to the first. The structure of the two-surface detector elements therefore corresponds to that shown in FIGS. 1 and 2. The four detector elements 50*a*, 50*b*, 50*c*, 50*d* are applied so that they respectively detect one of the four superposition sub-patterns which are produced by the four substructures 10*a* to 10*d* of the periodic structure 10, on the one hand, and the periodic structure 11 on the other hand. The phase offset in the x direction is then determined for each superposition sub-pattern in the manner described above with reference to FIGS. 1 and 2.

From the data delivered by the four detector elements 50*a* to 50*d*, the defocus term can be found uniquely by means of a conventional phase calculation algorithm, for example by Fourier transform. In principle, just three phase-offset substructures are sufficient for unequivocal determination of the defocus, but the phase calculation can often be carried out particularly advantageously with an even number of substructures.

For the phase calculation, the detector signals may be converted into binary values by means of an analog/digital converter. Even before this conversion, it is possible to increase the processing speed and/or simplify the evaluation by suitable interconnection of the detector signals (for example addition, subtraction and/or division).

Figure 5A:
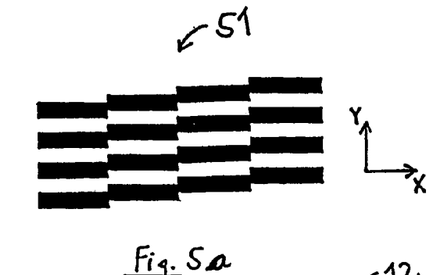
Figure 5B:
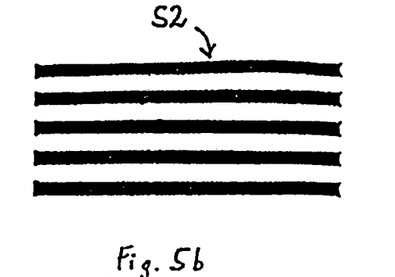

FIGS. 5*a* and 5*b* respectively show a plan view of a first periodic structure 51 having four periodic substructures and a second periodic structure 52 for a wavefront measuring device to determine the focus with phase shifting in the y direction. The periodic structures 51, 52 have a structure which corresponds to that of the periodic structures 10, 11 in FIGS. 3*a* and 3*b*, but they are merely rotated relative to them by 90° in the xy plane so that the periodicity direction of the structures 51, 52 extends in the y direction.

Figure 6:
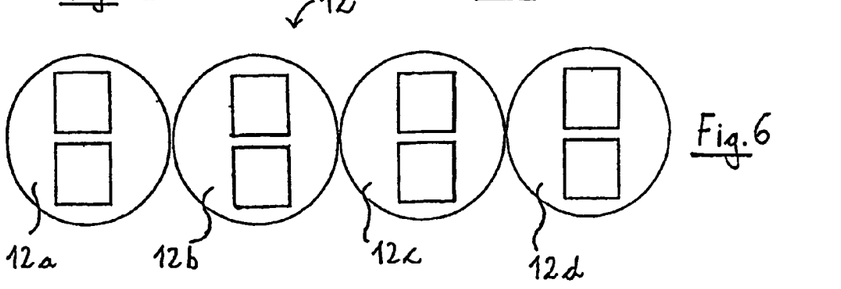
FIG. 6 shows a schematic plan view of a detector with four detector elements, respectively having two detector surfaces arranged next to each other in the y direction, for use in combination with the periodic structures in FIGS. 5a and 5b.

FIG. 6 shows a schematic plan view of a detector 12 with four detector elements 12*a*, 12*b*, 12*c*, 12*d*, respectively having two detector surfaces arranged next to each other in the y direction, for use in combination with the periodic structures in FIGS. 5*a* and 5*b*. The detector 12 with the detector elements 12*a*, 12*b*, 12*c*, 12*d* corresponds to the detector 50 in FIG. 4, and is merely rotated relative to it by 90° in the xy plane. The above comments about the detector 50 in FIG. 4 therefore apply accordingly to the function and effect of the detector 12.

According to the method described above with reference to FIGS. 3 and 4, the defocus can be determined by the detectors shown in FIGS. 5 and 6 when used alternatively or in combination. If a defocus measurement with phase shifting in the x direction is combined with a defocus measurement with phase shifting in the y direction, then it is also possible to determine the astigmatism. This requires the four gradient values of the wavefront derivatives in the x and y directions, and generally in two nonparallel directions.

Figure 7:
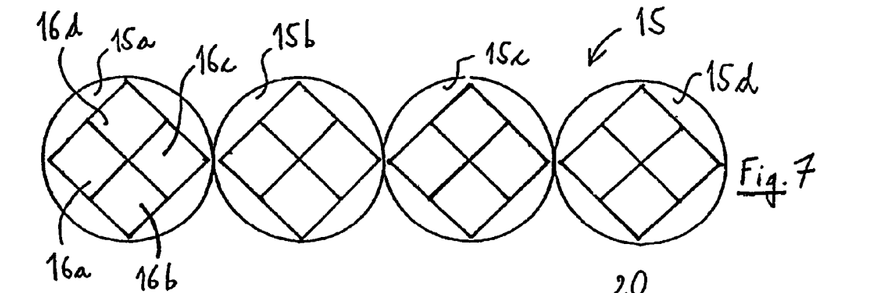
FIG. 7 shows a schematic plan view of a detector having four quadrant detector elements.

FIG. 7 shows a schematic plan view of a detector 15 with four quadrant detector elements 15*a*, 15*b*, 15*c*, 15*d*, each having four detector surfaces 16*a*, 16*b*, 16*c*, 16*d* which are arranged next to one another in a square on the xy plane. Using the detector 15, on the one hand, it is possible to determine the defocus, for example by detecting the superposition pattern generated by it from the periodic structures in FIG. 5 and evaluating the measurement signals of the detector surfaces 16*b*, 16*d* in order to determine the defocus. In another embodiment of the invention, on the other hand, one of the two periodic structures being used may have periodic substructures, for example offset in the x direction and with a periodicity direction in the x direction, the substructures being arranged next to one another in the x direction instead of in the y direction as shown in FIG. 3*a*. The superposition pattern of such a structure on the image side with a structure without offset substructures, as shown in FIG. 3*b*, can be evaluated by using the detector surfaces 16*a*, 16*c* of the quadrant detector 15 which are arranged next to one each in the x direction, so that the detector 15 can also determine the defocus in this way. The detector 15 is therefore also suitable for the aforementioned determination of astigmatism.

Instead of the arrangement as shown in FIGS. 3*a* and 5*a* for the phase-offset substructures lying next to one another in the direction perpendicular to the periodic direction, any other arrangements of the various substructures in the relevant structure plane are possible, for example as a matrix arrangement. For example, the four substructures in FIG. 3*a* or 5*a* may be arranged in a 2×2 quadrant structure.

Figure 8:
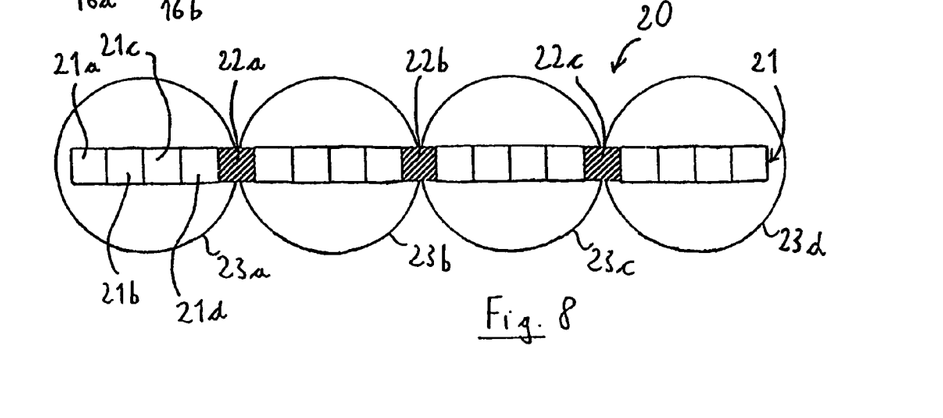
FIG. 8 shows a schematic plan view of a detector having a row of diodes, respectively with four detector surfaces inside a pupil image.

FIG. 8 shows a schematic plan view of a detector 20 having a row of diodes 21, each with four detector surfaces 21*a*, 21*b*, 21*c*, 21*d* inside a respective pupil image 23*a*, 23*b*, 23*c*, 23*d*. The shaded detector surfaces 22*a*, 22*b*, 22*c* in the transition region between the pupil images 23*a* to 23*d* are expediently not used for the phase calculation, i.e. the row of diodes 21 is divided into four detector elements for the four pupil images 23*a* to 23*d*, each with four detector surfaces 21*a* to 21*d*. A defocus measurement can be carried out by means of the detector 20 in a similar way to the method described above with reference to FIG. 7, with four periodic substructures being suitably arranged next to one another in the periodicity direction for this. In order to determine the defocus, the wavefront derivative is determined at four pupil points assigned to the detector surfaces 21*a*, 21*b*, 21*c*, 21*d*. The measurement accuracy can be increased by using more than two pupil points for the defocus determination.

Figure 9:
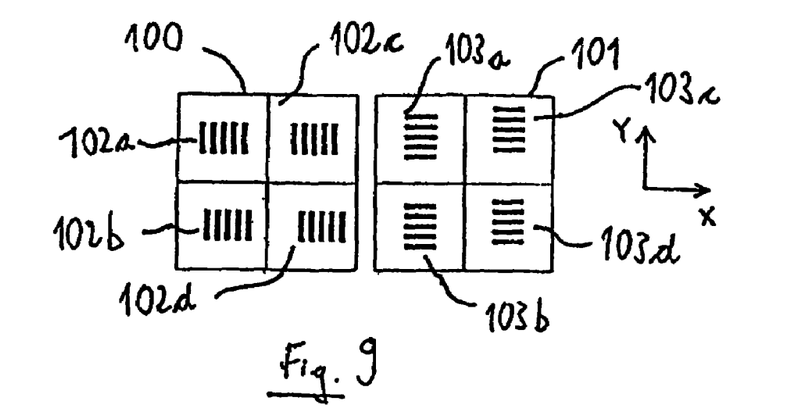
FIG. 9 shows a schematic plan view of two optical elements with periodic structures, respectively having four periodic substructures.
Figure 10:
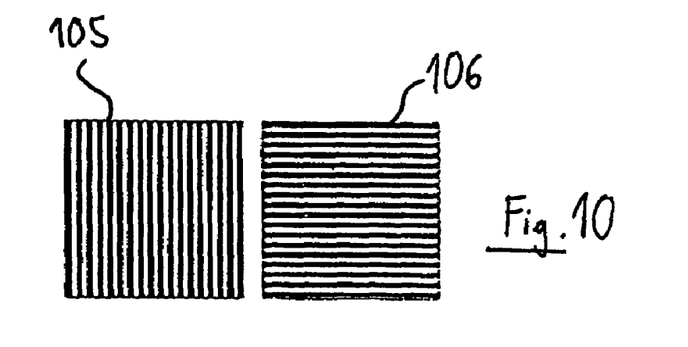
FIG. 10 shows a schematic plan view of two optical elements having periodic structures for use with the elements in FIG. 9.
Figure 11:
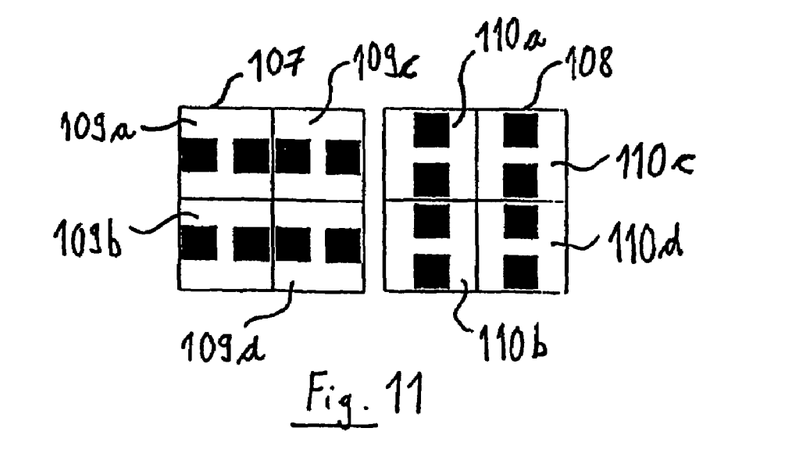
FIG. 11 shows a schematic plan view of two detectors, respectively having four two-surface detector elements for use with the elements in FIG. 9 and FIG. 10.

FIG. 9 shows a plan view of two first square optical elements 100, 101, respectively having four periodic substructures 102*a* to 102*d*, 103*a* to 103*d* to generate phase stages, relating to another preferred example of possible periodic structures and detector arrangements. FIG. 10 shows a plan view of two second square optical elements 105, 106 having periodic structures. FIG. 11 shows a plan view of two detectors 107 and 108, respectively having four two-surface detector elements 109*a* to 109*d*, 110*a* to 110*d* arranged in the square. The periodicity direction of the periodic structures shown in the left-hand image portion of FIGS. 9 and 10 points in the x direction of an xy coordinate system indicated in the figures, and the periodicity direction of the periodic structures shown in the right-hand image portion points in the y direction. The first optical elements 100, 101 are to be arranged on the object side, for example, and the second optical elements 105, 106 are to be arranged on the image side of an optical imaging system to be measured. The detector elements 109*a* to 110*d* are to be arranged after an image plane in the light path, and as shown in FIG. 11 the two detector surfaces of each detector element 109*a* to 110*d* are respectively arranged next to each other in the periodicity direction of the associated substructure 102*a* to 103*d*. Owing to the two mutually orthogonal periodicity directions, the optical elements 100, 101, 105, 106 and detectors 107, 108 shown in FIGS. 9 to 11 also make it possible to determine the astigmatism in addition to determining the defocus in a single measuring process.

Figure 12:
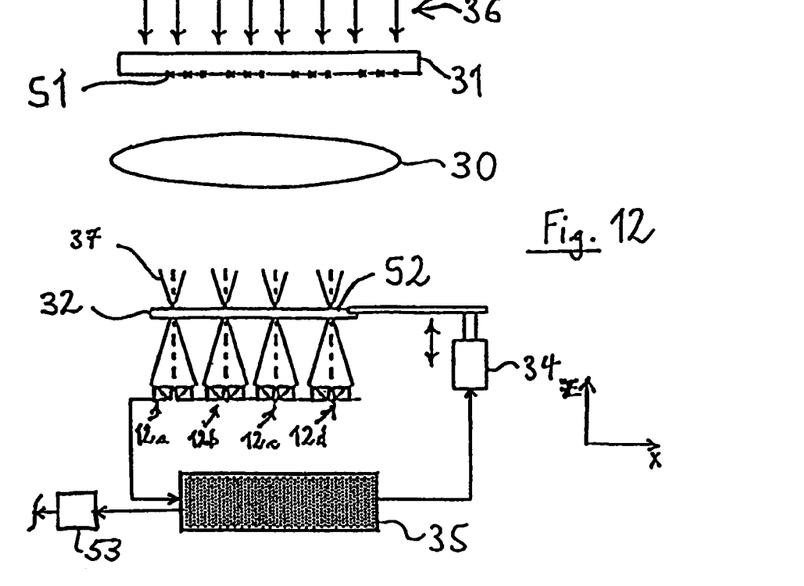
FIG. 12 shows a schematic side view of a wavefront measuring device for determining the focus and/or astigmatism of an optical imaging system.

FIG. 12 shows a schematic side view of a wavefront measuring device for determining the focus and/or astigmatism of an optical imaging system 30. In order to establish the orientation, an xyz coordinate system is indicated in FIG.

12. The device has a mask 31 fitted in the object plane, on which a first periodic structure 51 is arranged, for example according to FIG. 5*a*. A support device 32 fitted in the image plane of the imaging system 30 has a second periodic structure 52, for example according to FIG. 5*b*, which is positioned so that a superposition pattern is generated with the image of the first periodic structure 10. A plurality of detector elements 12*a* to 12*d*, for example according to the detector 12 in FIG. 6, are arranged along the x direction below the support device 32. An evaluation and control unit 35 is connected to the detector elements 12*a* to 12*d* and to an actuator 34.

During operation of the device, illuminating radiation 36 is shone onto the mask 31 so that the first periodic structure 51 present on the mask 31 is projected onto the second periodic structure 52. The superposition pattern produced by this is recorded separately for each of the four periodic substructures, respectively by one of the four detector elements 12*a* to 12*d*, as indicated by four separate light cones 37. The superposition pattern is then evaluated by the evaluation and control unit 35, for example in order to determine the defocus. The unit 35 controls the actuator 34 in order to vary the position of the support device 32 in the z direction and thus find the correct focal position. The superposition pattern may be evaluated with a speed in the kHz range so that, if need be, the defocusing can be identified while the imaging operation of the optical imaging system is taking place and can be corrected by the attached focus regulating and focus control unit 53, which employs the signals delivered by the evaluation and control unit 35 in order to adjust the focal plane position.

Figure 13:
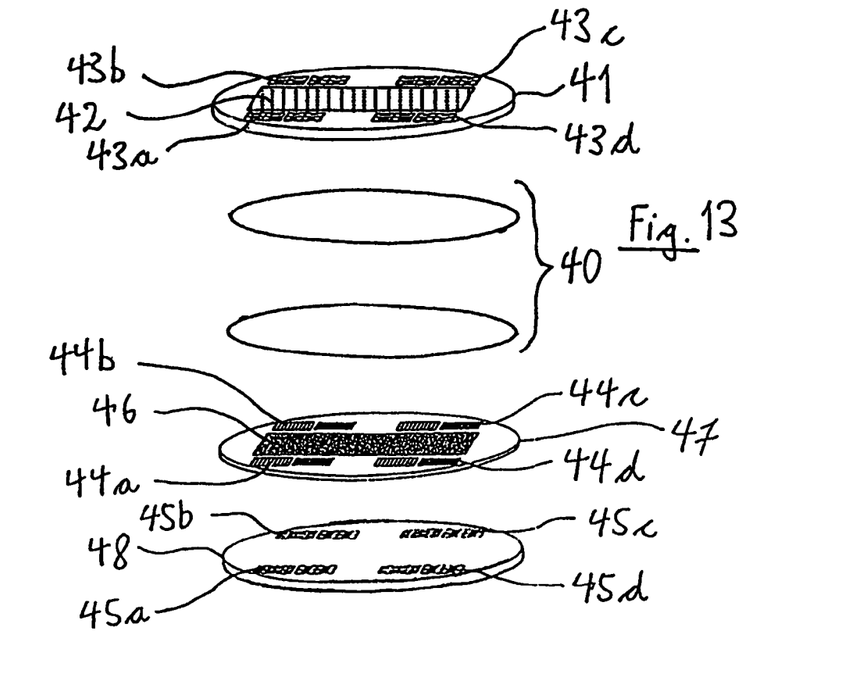
FIG. 13 shows a schematic perspective side view of a wavefront measuring device for determining the Petzval surface of an optical imaging system.

FIG. 13 shows a schematic perspective side view of a wavefront measuring device for determining the Petzval surface of an optical imaging system 40. When determining the Petzval surface, in particular, a tilt of the image plane relative to the object plane of the optical imaging system is also determined. A mask holder 41 is arranged in an object plane of the imaging system 40, and a working mask structure 42 to be projected as well as four first periodic structures 43*a*, 43*b*, 43*c*, 43*d* are fitted on it. Arranged in an image plane of the optical imaging system 40, there is a support device 47 having a photosensitive substrate 46, which is to be exposed to the working mask structure, and four second periodic structures 44*a*, 44*b*, 44*c*, 44*d* outside the region of the substrate 46. Four detectors 45*a*, 45*b*, 45*c*, 45*d* are arranged in a detector plane 48, behind the image plane in the light path.

Each of the first periodic structures 43*a*, 43*b*, 43*c*, 43*d* is in this case of the type shown in FIG. 9, for example. Correspondingly, the second periodic structures 44*a*, 44*b*, 44*c*, 44*d* are for example those according to FIG. 10. With active illuminating radiation, the first periodic structures are projected onto the second periodic structures and the corresponding superposition pattern is recorded by the detectors 45*a*, 45*b*, 45*c*, 45*d*, for example of the type according to FIG. 11. With the aid of these, it is possible to measure the focal position at four different places in the illumination field. The Petzval surface tilt can be calculated from these four measurements of the focal position, even during exposure operation of the optical imaging system, i.e. while the working mask structure 42 is being projected onto the substrate 46. The Petzval surface tilt can be determined commensurately more accurately when more periodic structures are used for the measurement, and can be accordingly adjusted precisely if need be.

Figure 14:
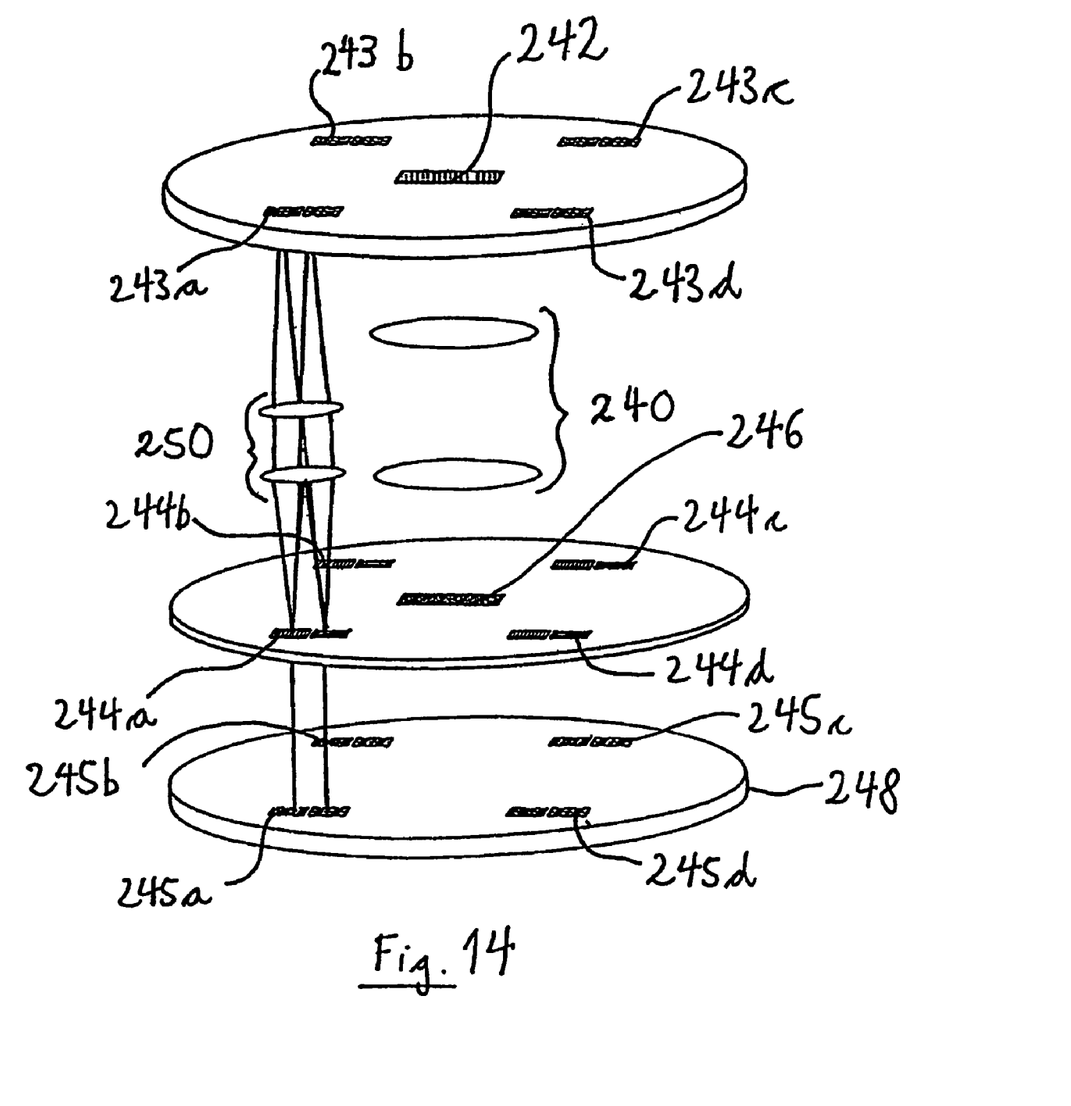
FIG. 14 shows a schematic perspective side view of a wavefront measuring device for determining the Petzval surface of a projection objective of a microlithography projection exposure system.

FIG. 14 shows a schematic perspective side view of a wavefront measuring device for determining the Petzval surface of a projection objective 240 of a microlithography projection exposure system. The device has a structure substantially identical to that in FIG. 13. In a projection objective for microlithography, a working mask structure 242 positioned in an object plane is usually much smaller than a substrate 246 to be exposed, typically a wafer. It is therefore not possible for first periodic structures 243*a* to 243*d*, which are provided next to the working mask structure, for example on a reticle, to be projected through the projection objective 240 itself into a region on the image side outside the working region of the substrate 246. In order to measure the image plane position, therefore, respective additional imaging optics are provided for projecting the first periodic structures 243*a* to 243*d* onto the second periodic structures 244*a* to 244*d*, which are outside the working region of the substrate 246. For the sake of clarity, only one of these four imaging optics 250 is represented by way of example in FIG. 14.

Figure 15:
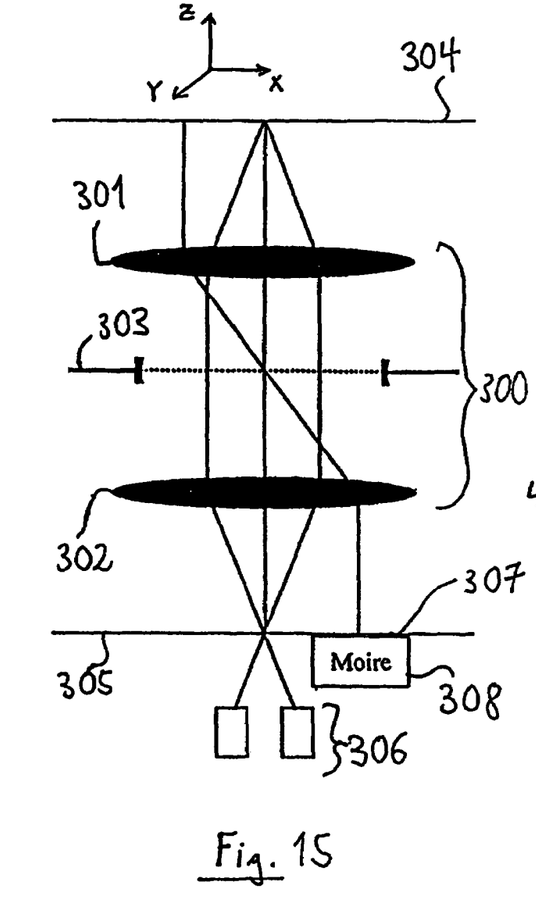
FIG. 15 shows a schematic side view of a device for determining the focus and/or astigmatism of an optical imaging system by means of a combined interferometric wavefront measuring technique and Moiré measuring technique.

FIG. 15 shows a schematic side view of a device for determining the focus and/or astigmatism of an optical imaging system 300 by means of a combined interferometric wavefront measuring technique and Moiré measuring technique. Of the optical imaging system 300, a lens 301 on the entry side, a lens 302 on the exit side and a pupil plane 303 with an aperture shutter are shown. A first periodic structure (not represented), for example one according to FIG. 3*a*, 5*a* or 9, is positioned in an object plane 304, and a second periodic structure, for example one according to FIG. 3*b*, 5*b* or 10, is positioned in an image plane 305. A detector 306 for interferometric wavefront measurement, for example one according to FIG. 4, 5 or 11, is arranged in a plane conjugate with the pupil plane 303 and is designed to determine the image plane position in the z direction of an xyz coordinate system.

A detector surface 307 of a Moiré detector 308, which is designed to determine the image plane position in the xy direction, is arranged in the image plane 305. As an alternative, a Moiré detector may be positioned with its detector surface behind the image plane 305, in which case the Moiré superposition pattern to be detected is projected onto the detector surface by means of imaging optics or a faceplate. With coherent illumination, it is also possible to place the detector surface in a Talbot plane behind the image plane 305. Any conventional structures of the relevant type may be used as the Moiré structures.

The combination of Moiré and wavefront measurement with a device shown in FIG. 15 therefore makes it possible to determine the focal position in all three spatial directions (xyz position determination), i.e. the device functions as an xyz position sensor. In this example, it is also possible to couple to a focus or positioning control loop in order to permit xyz positioning, i.e. adjustment of the image plane position in the x, y and z directions while the exposure operation of the imaging system is taking place.

Such control is possible both for the static case and for the dynamic case. The latter situation includes, for example exposure operation in which the object plane 304 is moved laterally relative to the image plane 305, typically with a constant speed, for example as in a wafer scanner. When this is operated, for example, a rectangular part of a mask positioned in the object plane 304 is illuminated and projected onto a corresponding part of a substrate positioned in the image plane 305, the mask and the substrate being displaced parallel or antiparallel along a scanning direction (for example the x direction) with the selected speed, until the entire mask is projected onto the substrate. A maximally constant speed of the relative movement of the object plane 304 and the image plane 305 is generally desirable in order to avoid degradation of the imaging quality. Accurate detection and adjustment of the relative speed to a corresponding value can be carried out in real time with the xyz sensor according to the invention and the associated control loop, owing to the short response times of these components.

In general, the sensor system according to the invention with its associated control loop makes it possible to adjust any optical imaging system with respect to imaging errors in situ, i.e. during its imaging operation, i.e. to compensate for the imaging errors which are found. The imaging errors may in this case have a wide variety of causes, which are taken into account as influencing factors by the controller. Particular examples of such influencing factors are lens heating effects, i.e. changes in the optical properties of optical components being used in the imaging system, ambient changes such as changes in the temperature, the moisture content and the pressure (for example an air pressure or flushing gas pressure), and in the case of imaging systems which operate with immersion, a change in the refractive index of the immersion medium, for example due to changes in the composition and/or the temperature of the immersion medium, movements of manipulators of the imaging system, movements and drift effects of a reticle stage or in general of an object support and/or a wafer stage or in general a substrate support on the image side, and/or changes in the wavelength and/or the polarization of the imaging radiation being used. When suitable imaging optics are used in order to project the measurement structures, it is possible to record the imaging errors without interrupting the imaging operation of the imaging system being monitored, i.e. for example without interrupting the wafer exposure process in the case of a lithography projection objective as the monitored system. If the measurement structures are projected through the projection objective, this may be done during exposure pauses of the normal wafer exposure operation.

Depending on the application, the control may affect one or more different manipulators belonging to the monitored optical imaging system. These may be, in particular, the x, y and/or z manipulators of optical components of the imaging system, reticle adjustment manipulators and/or pressure changing manipulators, for example to modify an air pressure or flushing gas pressure. In this way, for example, the astigmatism and focus typically encountered owing to the aforementioned influencing factors can be effectively and rapidly compensated for in real time during the imaging operation of the optical imaging system being monitored. If the measurement is carried out using the monitored optical imaging system itself, moreover, this has the advantage that it is also possible to record its influencing factors and the effect of the control can be determined directly.

As an alternative, the device may also be produced as a pure focus sensor diagnostic tool without a control loop, in order to determine the imaging error contributions due to the various aforementioned influencing factors.

Figure 16:
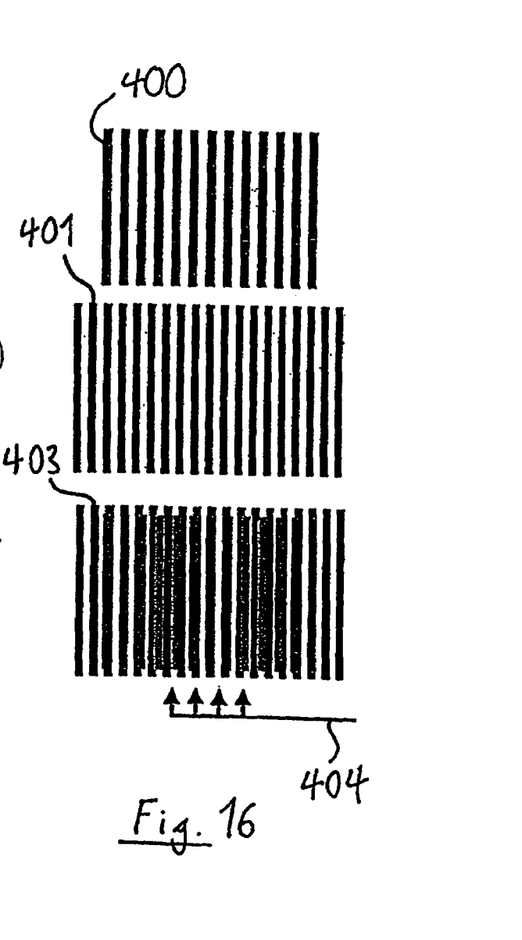
FIG. 16 shows a schematic plan view of a first Moiré structure and a second Moiré structure, and of a fringe superposition pattern generated by them.

FIG. 16 shows a schematic plan view of a first Moiré structure 400 and a second Moiré structure 401, and of a superposition pattern 403 generated by them. Slightly different period lengths are selected for the two Moiré structures, so that the superposition pattern 403 has a fringe pattern with a substantially longer period than the two Moiré structures 400, 401. The relatively long period of the fringe superposition pattern makes it correspondingly easier to place a plurality of detector surfaces, for example at positions next to one another in the periodicity direction as denoted by arrows 404, so that the positions of the detector surfaces have a defined phase offset with respect to the fringe superposition pattern. This placement of different detector surfaces at mutually phase-shifted positions of the fringe superposition pattern functionally corresponds to the aforementioned arrangement of a plurality of mutually phase-shifted periodic substructures when forming a Moiré superposition pattern, and it can therefore be used alternatively, for example as the Moiré measuring part in the device of FIG. 15.

Figure 17:
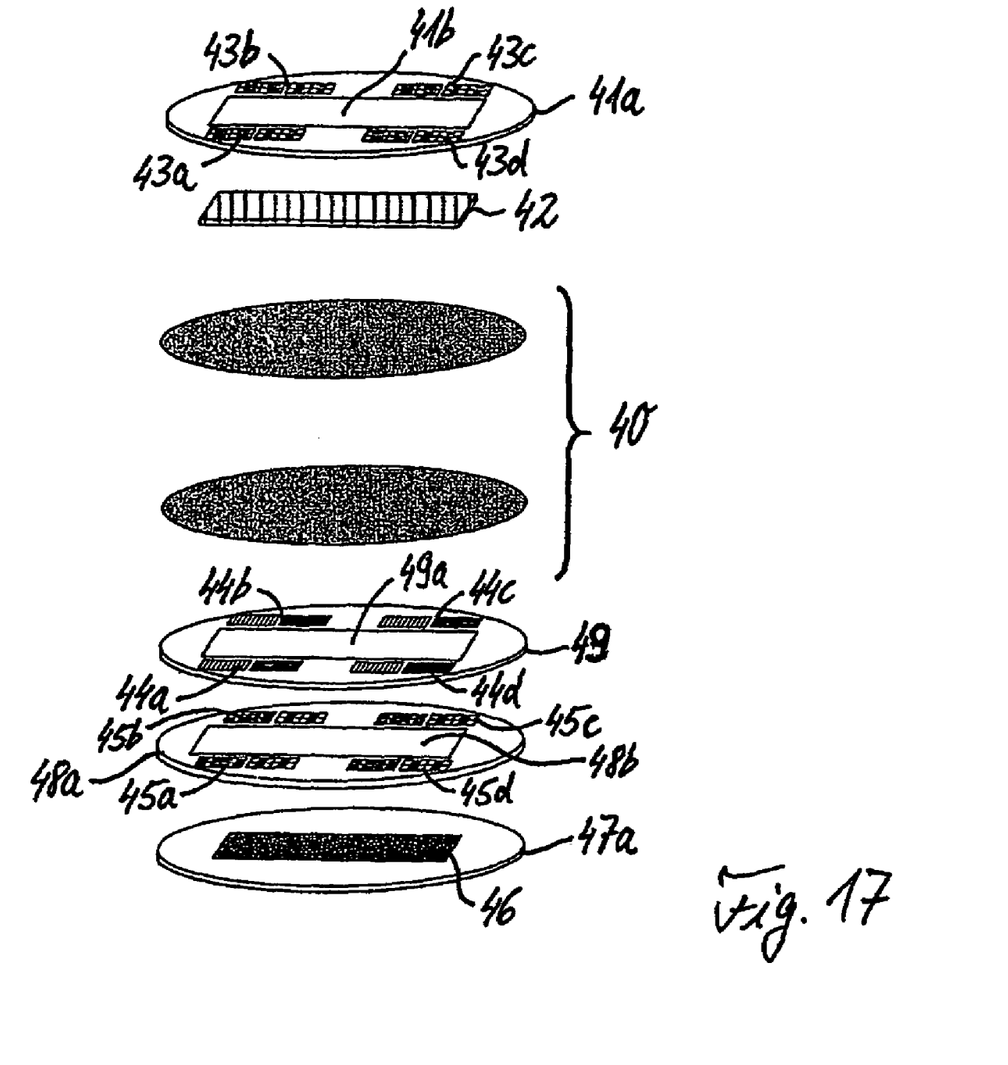
FIG. 17 shows a schematic perspective side view of a variant of the wavefront measuring device in FIG. 13.

FIG. 17 shows a variant of the wavefront measuring device in FIG. 13, with the same reference numerals being selected for functionally corresponding components in order to facilitate understanding. The function and properties of the device in FIG. 17 substantially correspond to those of FIG. 13, but differ from them in that the components shown are positioned at different places. The four first periodic structures 43a to 43d are thus provided on a suitable structure support 41a, which is positioned in front of the object plane of the imaging system 40 and has an opening 41b in order to transmit radiation to the working mask structure 42, which is arranged in the object plane. On the image side, the substrate 46 to be exposed is located on a separate substrate support 47a in the image plane, while the four second periodic structures 44a to 44b are positioned on a suitable structure support 49 at a suitable place in front of the image plane. A detector support 48a, which carries the four detectors 45a to 45d, is positioned in an associated detector plane between this structure support 49 on the image side and the substrate support 47a. The structure support 49 on the image side and the detector support 48a respectively have a central opening 49a and 48b, in order to transmit the exposure radiation emerging from the optical imaging system 40 to the substrate 46 to be exposed.

The device according to the invention for the determination of imaging errors of optical imaging systems is also suitable, in particular, for the measurement of projection objectives of microlithography projection exposure systems. As an alternative to those shown, it is also possible to use other detectors which operate with relatively few detector surfaces and thus permit rapid evaluation, for example rows of CCDs. For instance, it is possible to evaluate the focal position, the astigmatism and/or the Petzval surface position in real time with measuring frequencies of from 30 Hz to a few kilohertz. It is also possible to select more than four, for example eight or more periodic substructures as well as a different spatial arrangement of these. The periodic gratings as shown, which operate in transmission, may likewise be replaced by gratings operated in reflection, especially when using illuminating light wavelengths in the EUV range which is employed in modern projection exposure systems.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A device for the determination of imaging errors of an optical imaging system using a radiation-superposition measuring technique which operates with lateral phase offset, comprising:

an optical element arranged on the object side of the imaging system, having a first periodic structure on the object side with a predetermined periodicity direction, an optical element arranged on the image side of the imaging system, having a second periodic structure on the image side with a periodicity direction corresponding to the first periodic structure, an image of the first periodic structure together with the second periodic structure forming an interference or superposition pattern, and a detector to detect the interference or superposition pattern, wherein at least one of the first and second periodic structures contains at least three periodic substructures, which are arranged offset relative to one another by a predetermined phase offset in the periodicity direction, and the detector has a plurality of detector elements, the number of which is matched to the number of substructures or which respectively have a number of detector surfaces for a predetermined aberration determination.

2. The device according to claim 1, wherein one detector element for each periodic substructure is provided on the detector, and the detector element has at least two detector surfaces arranged mutually offset in the periodicity direction.

3. The device according to claim 1, wherein a row of CCDs aligned in the periodicity direction of the periodic structures, a row of diodes or a quadrant sensor arrangement is used as the detector.

4. The device according to claim 1, wherein the relative phase offset is one fourth of the period length of the periodic structures.

5. The device according to claim 1, wherein the device determines a Petzval surface position, and the optical elements have at least three first and three second periodic structures, which are not positioned at locations lying on a line.

6. The device according to claim 1, wherein the aberration determination includes at least one of a focus determination and an astigmatism determination.

7. A device for the determination of imaging errors of an optical imaging system using a Moiré measuring technique, comprising:

an optical element arranged on the object side of the imaging system, having a first periodic structure on the object side with a predetermined periodicity direction, an optical element arranged on the image side of the imaging system, having a second periodic structure on the image side with a periodicity direction corresponding to the first periodic structure, an image of the first periodic structure together with the second periodic structure forming a superposition pattern, and a detector to detect the superposition pattern, wherein the first and second periodic structures are Moiré structures which produce a beat fringe pattern of the superposition pattern, the detector detects the superposition pattern at least at three locations which are phase-offset relative to the beat fringe pattern, and the beat fringe pattern has a longer period than the first and second periodic structures.

8. The device according to claim 1 or 7, wherein the device measures imaging errors with a measurement speed of up to several kilohertz.

9. The device according to claim 1 or 7, wherein the device measures illuminating radiation which is also employed by the optical imaging system in normal imaging operation.

10. The device according to claim 1 or 7, wherein the detector detects the interference or superposition pattern in an image plane or a Talbot plane of the optical imaging system or behind the image plane with the interposition of imaging optics or a faceplate.

11. The device according to claim 1 or 7, wherein the device determines at least one of the image plane position in a z direction parallel to the beam path of the optical imaging system, the image plane position in an xy direction perpendicular to this and a tilt of the image plane relative to the object plane of the optical imaging system.

12. The device according to claim 1 or 7, wherein the device determines imaging errors due to at least one of the group of influencing factors comprising lens heating effects, ambient changes, refractive index changes of an immersion medium, movement and drift effects of manipulators of the imaging system, wavelength changes and polarization changes of the imaging radiation being used.

13. The device according to claim 1 or 7, further comprising a control loop to compensate for one or more imaging errors which have been determined.

14. The device according to claim 13, wherein the control loop controls at least one of the image distance in the z direction, the object distance in the z direction, the image position in the xy direction, the object position in the xy direction, a relative tilt of the image plane, and a relative tilt of the object plane for the optical image imaging system as a function of an output signal of the detector.

15. The device according to claim 13, wherein the control loop acts on at least one manipulator of the optical imaging system, the at least one manipulator being selected from the group which comprises at least one manipulator for adjusting one or more optical components respectively in one, two or three spatial directions, at least one manipulator for adjusting an object support, a manipulator for adjusting an image support, a manipulator for adjusting an ambient pressure and a manipulator for changing the refractive index of an immersion liquid.

16. A microlithography projection exposure system, including a device for the determination of imaging errors in a projection objective of the projection exposure system using a radiation-superposition measuring technique which operates with lateral phase offset, the device comprising:

an optical element arranged on the object side of the imaging system, having a first periodic structure on the object side with a predetermined periodicity direction, an optical element arranged on the image side of the imaging system, having a second periodic structure on the image side with a periodicity direction corresponding to the first periodic structure, an image of the first periodic structure together with the second periodic structure forming an interference or superposition pattern, and a detector to detect the interference or superposition pattern, wherein at least one of the first and second periodic structures contains at least three periodic substructures, which are arranged offset relative to one another by a predetermined phase offset in the periodicity direction, the detector has a plurality of detector elements, the number of which is matched to the number of substructures or which respectively have a number of detector surfaces for a predetermined aberration determination, and the device has additional imaging optics for imaging the first periodic structure onto the second periodic structure.

17. A microlithography projection exposure system, including a device for the determination of imaging errors in a projection objective of the projection exposure system using a Moiré measuring technique, the device comprising:
an optical element arranged on the object side of the imaging system, having a first periodic structure on the object side with a predetermined periodicity direction,
an optical element arranged on the image side of the imaging system, having a second periodic structure on the image side with a periodicity direction corresponding to the first periodic structure, an image of the first periodic structure together with the second periodic structure forming a superposition pattern, and
a detector to detect the superposition pattern,
wherein
the first and second periodic structures are Moiré structures which produce a beat fringe pattern of the superposition pattern,
the detector detects the superposition pattern at least at three locations which are phase-offset relative to the beat fringe pattern,
the device has additional imaging optics for imaging the first periodic structure onto the second periodic structure, and
the beat fringe pattern has a longer period than the first and second periodic structures.

18. A method for the determination of imaging errors of an optical imaging system using a radiation-superposition measuring technique, comprising:
arranging an optical element, having a first periodic structure on the object side with a predetermined periodicity direction, on the object side of the imaging system,
arranging an optical element, having a second periodic structure on the image side with a periodicity direction corresponding to the first periodic structure, on the image side of the imaging system, an image of the first periodic structure together with the second periodic structure forming an interference or superposition pattern, and
detecting the interference or superposition pattern with a detector, and evaluating the pattern for imaging error determination,
wherein at least one of the first and second periodic structures contains at least three periodic substructures, which are arranged offset relative to one another by a predetermined phase offset in the periodicity direction, and the detector has a plurality of detector elements, the number of which is matched to the number of substructures and/or which respectively have a number of detector surfaces for a predetermined aberration determination, in particular a focus and/or astigmatism determination,
or the first and second periodic structures are Moiré structures, which produce a fringe pattern of the superposition pattern, and the detector detects the superposition pattern at least at three locations which are phase-offset relative to the fringe pattern.

19. The method according to claim 18, wherein at least one predetermined parameter for the optical imaging system is controlled as a function of the imaging error or errors which have been determined.

20. The method according to claim 19, wherein at least one predetermined parameter selected from a group which consists of parameters that can be adjusted by associated manipulators of the optical imaging system is controlled as a function of the imaging error or errors which have been determined.

* * * * *